(12) United States Patent
Kholodenko et al.

(10) Patent No.: US 8,557,051 B2
(45) Date of Patent: Oct. 15, 2013

(54) METHOD FOR USING GENERATOR FOR FOAM TO CLEAN SUBSTRATE

(75) Inventors: Arnold Kholodenko, San Francisco, CA (US); Anwar Husain, Pleasanton, CA (US); Gregory A. Tomasch, Kelseyville, CA (US); Cheng-Yu (Sean) Lin, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/445,868

(22) Filed: Apr. 12, 2012

(65) Prior Publication Data
US 2012/0255618 A1    Oct. 11, 2012

Related U.S. Application Data

(62) Division of application No. 12/185,780, filed on Aug. 4, 2008, now Pat. No. 8,161,984.

(51) Int. Cl.
*B08B 3/00* (2006.01)
*B05B 7/04* (2006.01)

(52) U.S. Cl.
USPC .......... 134/36; 134/37; 239/8; 239/9; 239/10; 239/434; 239/434.5

(58) Field of Classification Search
USPC ............ 134/22.1, 22.11, 36, 37; 239/8, 9, 10, 239/434, 434.5, 399, 440, 441; 169/43, 44, 169/45
See application file for complete search history.

(56) References Cited

U.S. PATENT DOCUMENTS

| 4,133,773 | A  | * | 1/1979  | Simmons  | 261/21 |
| 2004/0261823 | A1 | * | 12/2004 | de Larios | 134/31 |

* cited by examiner

*Primary Examiner* — Saeed T Chaudhry
(74) *Attorney, Agent, or Firm* — Martine Penilla Group, LLP

(57) ABSTRACT

A system for cleaning a substrate with a foam performs a method for generating a cleaning foam. In the first operation of the method, the system pumps a fluid into a premix chamber. The premix chamber is a component of a male plug which fits into a female housing in the system. Then the system injects a gas into the premix chamber to initiate generation of the foam from the fluid. The foam flows from the premix chamber into a sealed helical channel formed by a helical indentation on an outside surface of the male plug and an inner surface of the female housing to allow the foam to reach a desired state along a length of the sealed helical channel. In the last operation of the method, the foam outputs from an exit end of the helical channel through the male plug to a component of the system.

20 Claims, 13 Drawing Sheets

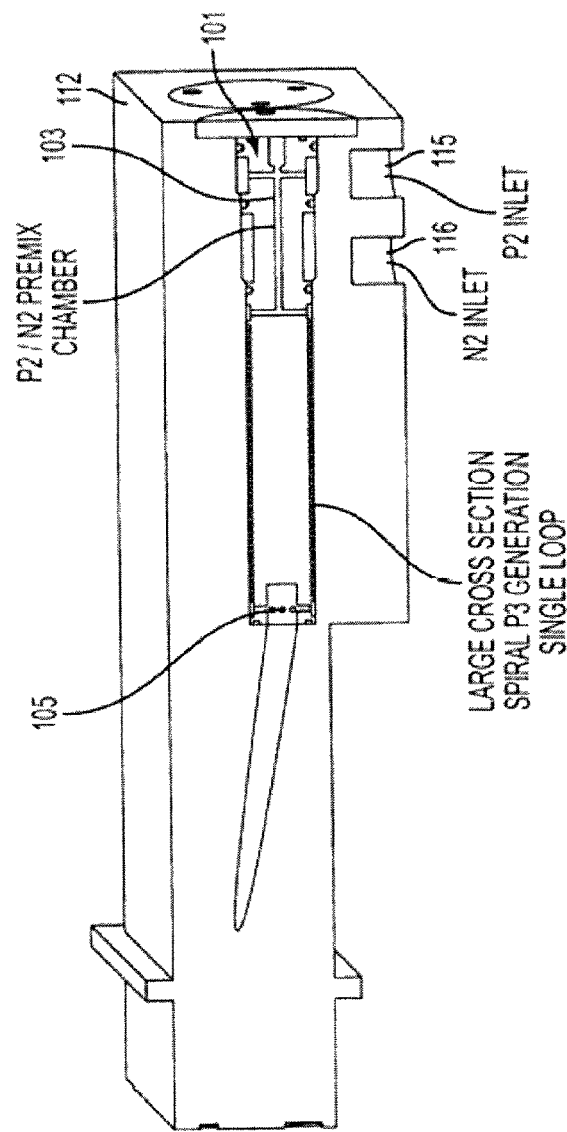

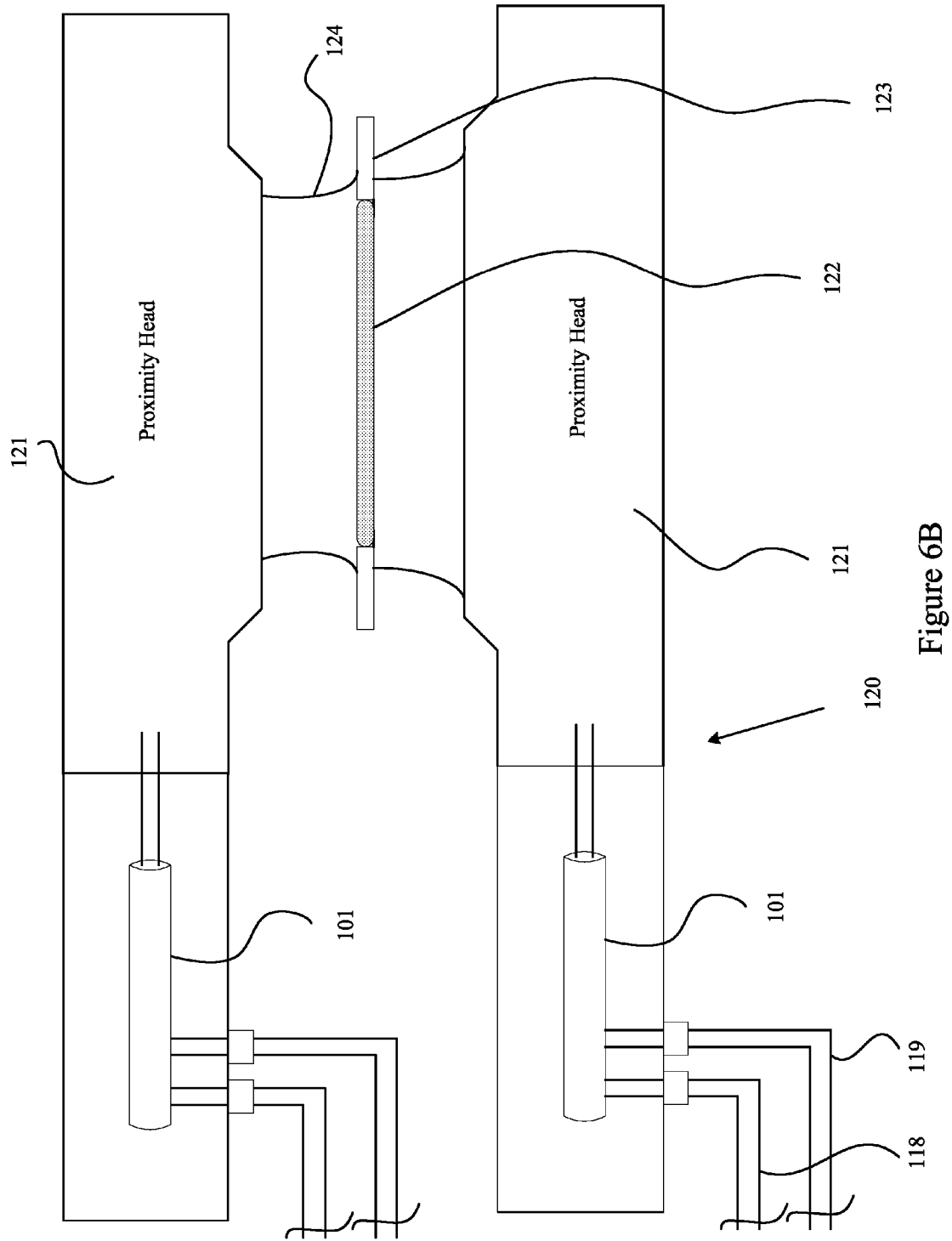

Figure 9

Long Generator

| Quality | % | 98 | 95 | 93 | 91 | 89 | 85 | 80 | 75 | 67 | 57 |
|---|---|---|---|---|---|---|---|---|---|---|---|
| N2 | sccm | 100 | 100 | 100 | 100 | 100 | 100 | 100 | 100 | 100 | 100 |
| P2 | mL/m | 2.5 | 5 | 7.5 | 10 | 12.5 | 17.65 | 25 | 33.33 | 49.25 | 75 |
| Surface Bubble Size (avg) | um | 130 | 155 | 179 | 180 | 173 | 139 | 136 | 132 | 132 | 117 |
| Surface Bubble Spacing (avg) | um | 276 | 278 | 362 | 396 | 330 | 295 | 284 | 271 | 256 | 303 |
| Bulk Bubble Size (avg) | um | 178 | 162 | 168 | 150 | 186 | 168 | 147 | 175 | 142 | 150 |
| Bulk Bubble Spacing (avg) | um | 195 | 181 | 181 | 164 | 219 | 211 | 159 | 222 | 149 | 195 |

Long Generator with larger cross section

| Quality | % | 98 | 95 | 93 | 91 | 89 | 85 | 80 | 75 | 67 | 57 |
|---|---|---|---|---|---|---|---|---|---|---|---|
| N2 | sccm | 100 | 100 | 100 | 100 | 100 | 100 | 100 | 100 | 100 | 100 |
| P2 | mL/m | 2.5 | 5 | 7.5 | 10 | 12.5 | 17.65 | 25 | 33.33 | 49.25 | 75 |
| Surface Bubble Size (avg) | um | 159 | 132 | 138 | 195 | 181 | 136 | 125 | 131 | 139 | 138 |
| Surface Bubble Spacing (avg) | um | 321 | 237 | 302 | 427 | 376 | 297 | 274 | 267 | 264 | 236 |
| Bulk Bubble Size (avg) | um | 171 | 203 | 205 | 157 | 176 | 171 | 154 | 167 | 136 | 163 |
| Bulk Bubble Spacing (avg) | um | 187 | 223 | 241 | 177 | 198 | 188 | 165 | 200 | 172 | 168 |

Generator, one inch shorter

| Quality | % | 98 | 95 | 93 | 91 | 89 | 85 | 80 | 75 | 67 |
|---|---|---|---|---|---|---|---|---|---|---|
| N2 | sccm | 100 | 100 | 100 | 100 | 100 | 100 | 100 | 100 | 100 |
| P2 | mL/m | 2.5 | 5 | 7.5 | 10 | 12.5 | 17.65 | 25 | 33.33 | 49.25 |
| Surface Bubble Size (avg) | um | 369 | 282 | 281 | 169 | 187 | 151 | 134 | 136 | 142 |
| Surface Bubble Spacing (avg) | um | 527 | 504 | 527 | 434 | 446 | 366 | 316 | 308 | 377 |
| Bulk Bubble Size (avg) | um | 175 | 154 | 176 | 162 | 193 | 173 | 189 | 180 | 194 |
| Bulk Bubble Spacing (avg) | um | 201 | 163 | 234 | 204 | 250 | 198 | 209 | 235 | 234 |

Generator, two inch shorter

| Quality | % | 98 | 95 | 93 | 91 | 89 | 85 | 80 | 75 | 67 |
|---|---|---|---|---|---|---|---|---|---|---|
| N2 | sccm | 100 | 100 | 100 | 100 | 100 | 100 | 100 | 100 | 100 |
| P2 | mL/m | 2.5 | 5 | 7.5 | 10 | 12.5 | 17.65 | 25 | 33.33 | 49.25 |
| Surface Bubble Size (avg) | um | 357 | 304 | 321 | 308 | 175 | 171 | 129 | 173 | |
| Surface Bubble Spacing (avg) | um | 502 | 465 | 481 | 503 | 470 | 525 | 461 | 374 | |
| Bulk Bubble Size (avg) | um | 205 | 173 | 183 | 180 | 211 | 193 | 178 | 196 | |
| Bulk Bubble Spacing (avg) | um | 275 | 214 | 236 | 229 | 284 | 234 | 206 | 265 | |

| | | New Generator | | | | | Long Bead Pack | | | | |
|---|---|---|---|---|---|---|---|---|---|---|---|
| Quality | % | 91 | 91 | 91 | 91 | 91 | 91 | 91 | 91 | 91 | 91 |
| | | 100 | 200 | 300 | 400 | 500 | 100 | 200 | 300 | 400 | 500 |
| | | 10 | 120 | 30 | 40 | 50 | 10 | 20 | 30 | 40 | 50 |
| Surface Bubble Size (average) | µm | 244 | 135 | 141 | 134 | 143 | 266 | 196 | 154 | 131 | 127 |
| Surface Bubble Spacing (average) | µm | 464 | 291 | 314 | 318 | 319 | 485 | 400 | 238 | 265 | 246 |
| Bulk Bubble Size (average) | µm | 198 | 155 | 138 | 132 | 134 | 163 | 108 | 226 | 224 | 221 |
| Bulk Bubble Spacing (average) | µm | 154 | 182 | 197 | 190 | 163 | 184 | 149 | 211 | 210 | 218 |
| Turbidity (average bubble size) | µm | 380 | 411 | 360 | 365 | 278 | 362 | 278 | 302 | 300 | 282 |

Figure 10

METHOD FOR USING GENERATOR FOR FOAM TO CLEAN SUBSTRATE

CLAIM OF PRIORITY

This application is a divisional application of U.S. patent application Ser. No. 12/185,780, now U.S. Pat. No. 8,161,984, entitled "Generator for Foam to Clean Substrate," which was filed on Aug. 4, 2008, and was published on Feb. 4, 2010, as U.S. Published Patent Application No. 2010/0024842, whose disclosure is hereby incorporated herein by reference in its entirety.

BACKGROUND

As described in numerous published patent applications, a system has been developed for cleaning particles from a semiconductor wafer with a high viscosity, non-Newtonian fluid deposited at a low velocity. See e.g., U.S. Published Patent Application No. 2006/0283486 entitled "Method and Apparatus for Cleaning a Substrate Using Non-Newtonian Fluids," filed on Jun. 15, 2005, U.S. Published Patent Application No. 2006/0128590 entitled "Method for Removing Contamination from a Substrate and for Making a Cleaning Solution," filed on Feb. 3, 2006, and U.S. Published Patent Application No. 2006/0128600 entitled "Cleaning Compound and Method and System for Using the Cleaning Compound," filed on Feb. 3, 2006, all of which are hereby incorporated by reference.

In particular implementations, the high viscosity, non-Newtonian fluid is a foam created by mechanically mixing a gas (such as nitrogen) and a fluid (an aqueous solution with a surfactant such as a fatty acid capable of forming micelles) in the microchannels formed by a packet of thousands of sapphire beads (e.g., approximately 1 mm in diameter).

There are considerable drawbacks to such implementations. Sapphire beads are relatively expensive and react with the foam. Moreover, bead packets tend to clog fairly frequently and take considerable time and expense to clean.

As a result of these drawbacks, there is a need to provide an inexpensive, readily maintainable apparatus, method, and system for mechanically generating a foam to clean a substrate (e.g., a semiconductor wafer).

SUMMARY

Example embodiments include apparatuses, systems, and methods directed to mechanically generating a foam to clean a substrate. In one example embodiment, a device includes a female housing and a male plug. The plug includes an aperture into which a fluid flows from another part of the cleaning system. The plug includes a premix chamber which receives the fluid from the aperture and into which a gas such as nitrogen is injected to form an initial foam. In one particular example embodiment, the chamber is a hollow cylinder and the gas is injected into the cylinder through channels which are tangential to the cylinder. Additionally, the plug includes a solid cylinder with a continuous helical indentation on the outside of the solid cylinder. When the male plug is inserted into the female housing, the continuous helical indentation and the inner surface of the housing form a sealed helical channel through which the initial foam flows and is further mixed as the foam makes its way to another aperture which connects the plug to another component of the cleaning system, e.g., a proximity head where the final foam is applied to a semiconductor wafer. In one particular example embodiment, the plug and the housing are proximate to the proximity head where the final foam is applied to the semiconductor wafer, e.g., the plug and housing are located at the point of use of the final foam. In another example embodiment, the plug and housing are located away from the point of use of the final foam in another part of the cleaning system (e.g., in an onboard fluid delivery system).

The advantages of the present invention will become apparent from the following detailed description, which taken in conjunction with the accompanying drawings, illustrates by way of example the principles of the invention.

BRIEF DESCRIPTION OF THE DRAWINGS

FIG. 5 is a diagram illustrating a sectional view of a male plug and female housing in a point-of-use system, in accordance with an example embodiment.

FIG. 6B is a simplified schematic diagram showing a pair of male plugs in a point-of-use system, in accordance with an example embodiment.

FIG. 9 is a table showing the results of the tests with respect to channel cross section and channel length, for example embodiments.

FIG. 10 is a table showing a comparison of the foam generator with a plug and housing and a foam generator with a long bead pack.

DETAILED DESCRIPTION

In the following description, numerous specific details are set forth in order to provide a thorough understanding of the example embodiments. However, it will be apparent to one skilled in the art that the example embodiments may be practiced without some of these specific details. In other instances, implementation details and process operations have not been described in detail, if already well known.

Figure 1:
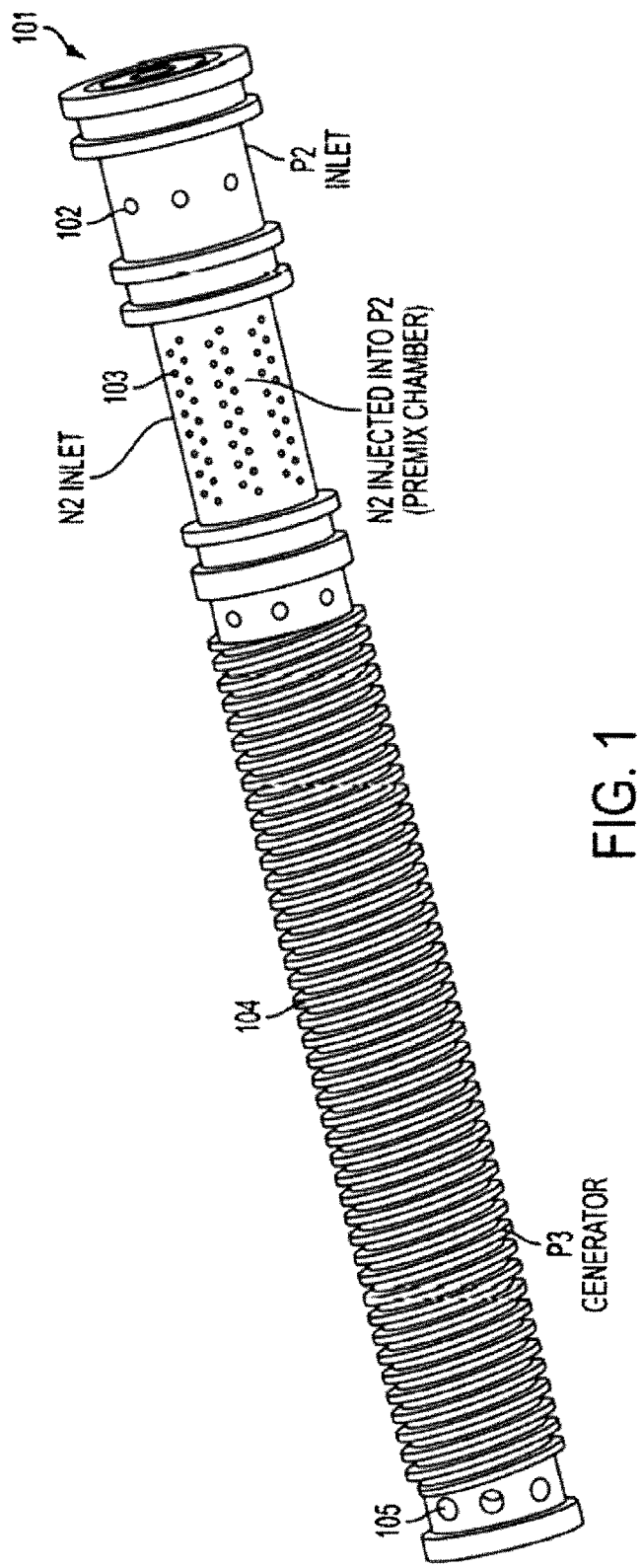
FIG. 1 is a diagram illustrating a perspective view of a male plug, in accordance with an example embodiment.

FIG. 1 is a diagram illustrating a perspective view of a male plug, in accordance with an example embodiment. In FIG. 1, the male plug 101 includes an aperture 102 into which a fluid (e.g., P2) is input or pumped by a system for cleaning a substrate (e.g., a semiconductor wafer). In particular example embodiments, the flow rate for the fluid might be 5 mL/m to 50 mL/m. From the aperture 102, the fluid flows into a premix chamber 103, where the fluid is injected with a gas (e.g., N2 or nitrogen) to form an initial foam. In particular example embodiments, the flow rate for the injected gas might be 50 sccm to 500 sccm. From the premix chamber 103, the initial foam flows through the continuous helical indentation 104 on an outer surface of the plug to the aperture 105, which outputs a final foam (e.g., P3) to the cleaning system. In this figure, the term "P2" refers to the two phases of matter that are present in the input fluid, e.g., liquid water and solid surfactant. The term "P3" refers to the three phases of matter that are present in the output foam, e.g., liquid water, solid surfactant, and gaseous nitrogen. It will be appreciated that P3 is a high viscosity, non-Newtonian fluid.

In particular example embodiments, the male plug might be made from a highly nonreactive thermoplastic such as polyvinylidene chloride (PVDF) or KYNAR (also called HYLAR or SYGEF). In other alternative example embodiments, the plug might be made of ethylene chlorotrifluoroethylene (ECTFE) or halar. It will be appreciated that it might be beneficial to match the material used to make the male plug with the material used to make the female housing (e.g., the male plug and the female housing would then have the same coefficient of thermal expansion).

Figure 2:
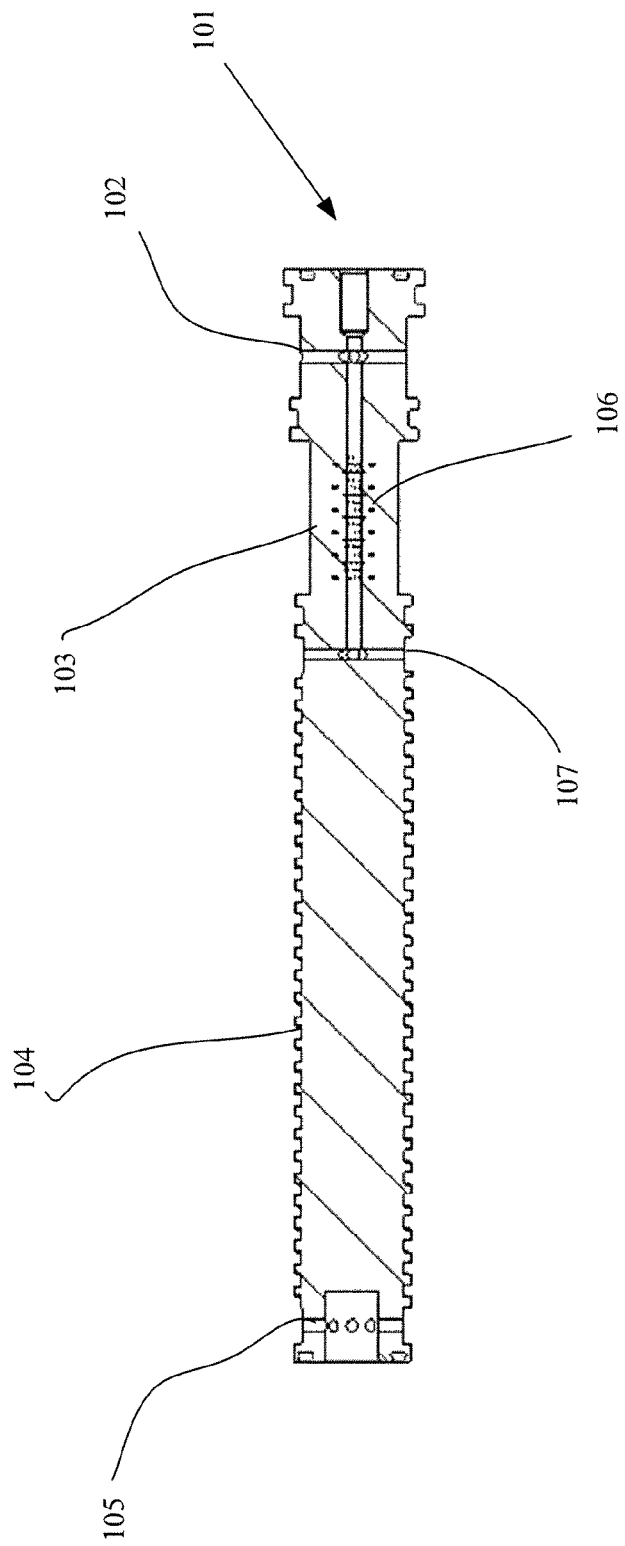
FIG. 2 is a diagram illustrating a sectional view of a male plug, in accordance with an example embodiment.

FIG. 2 is a diagram illustrating a sectional view of a male plug, in accordance with an example embodiment. In FIG. 2, the male plug 101 includes a premix chamber 103 which has a hollow core and which contains numerous perforations 106 on the outside surface of the premix chamber 103, which permit the input of a gas (e.g., nitrogen), as described further below. The male plug 101 also includes an aperture 102 into which a fluid (e.g., P2) enters the premix chamber 103 and an aperture 107 from which an initial foam (e.g., nitrogen and P2) exits the premix chamber 103. After exiting the premix chamber, the initial foam passes through the continuous helical indentation 104 on an outer surface of the plug. As depicted in FIG. 2, the plug beneath the continuous helical indentation is solid, to provide structural support. However, in other example embodiments, the plug beneath the continuous helical indentation might also have a hollow core. Once the initial foam traverses the channel formed by the continuous helical indentation, the initial foam emerges as a final foam (e.g., P3) which enters the aperture 105 and proceeds to another component of the cleaning system, e.g., a proximity head where the foam is delivered at low velocity to a substrate.

In particular example embodiments, such a proximity head is proximate to the male plug 101 and the housing for the plug. That is, the plug 101 and the housing generate a foam at the point of use of the foam. However, in particular example embodiments, the final foam (e.g., P3) will maintain its mixture (e.g., its bubbles) for a relatively long period of time when confined in a sealed passageway (e.g., a tube) and the foam might be transported through such a passageway to a proximity head which is relatively distant from the plug 101 and housing (e.g., in an onboard fluid delivery system).

Figure 3:
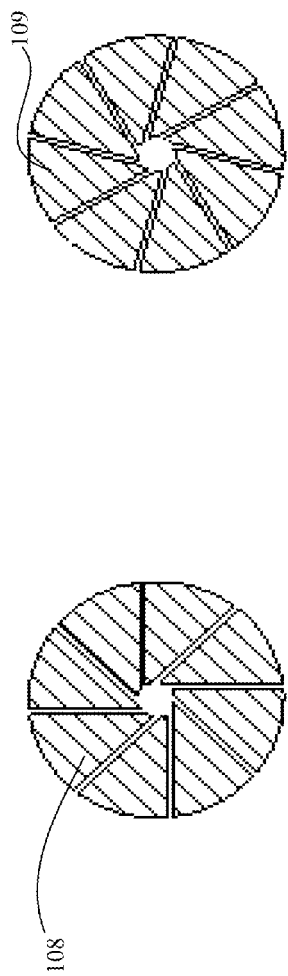
FIG. 3 is a diagram illustrating a cross-sectional view of a premix chamber in a male plug, in accordance with an example embodiment.

FIG. 3 is a diagram illustrating a cross-sectional view of a premix chamber in a male plug, in accordance with an example embodiment. In FIG. 3, the male plug 101 includes aperture 102 which allows entry of a fluid (e.g., P2) to a premix chamber 103. As depicted in FIG. 3, the premix chamber 103 has numerous small perforations which are channels for the injection of a gas (e.g., nitrogen) and which follow a specific pattern. As indicated in the annotation on the right side of FIG. 3, the pattern is created by rotating by 15 degrees a set of eight equidistant channels (e.g., with each channel 45 degrees from its two neighboring channels) which are coplanar in a cross-sectional plane. The rotation is shown pictorially in the cross-sections 108 and 109 on the left side of FIG. 3. Cross-section 108 (e.g., B-B from 103) shows eight equidistant channels prior to the rotation by 15 degrees. Cross-section 109 (e.g., C-C from 103) shows eight equidistant channels after rotation by 15 degrees. Cross-sections 108 and 109 also illustrate the hollow core of the premix chamber 103. It will be appreciated that the fluid (e.g., P2) flows through this hollow core. It will further be appreciated that the eight equidistant channels are located tangential to this hollow core, e.g., the arrangement between the hollow core and the channels is not akin to a hub and spokes. In particular example embodiments, the tangential location of the channels and the pattern (e.g., rotation by 15 degrees) facilitate the creation of a vortex within the premix chamber 103 and the vortex facilitates mixing of the fluid (e.g., P2) and gas (e.g., nitrogen).

In an alternative example embodiment, the pattern for the perforations might be created by rotating by 15 degrees a set of 6 or 10 equidistant channels, rather than 8. Similarly, in an alternative example embodiment, the rotation might be more (e.g., 20-25 degrees) or less (e.g., 5-10 degrees) than 15 degrees.

Figure 4:
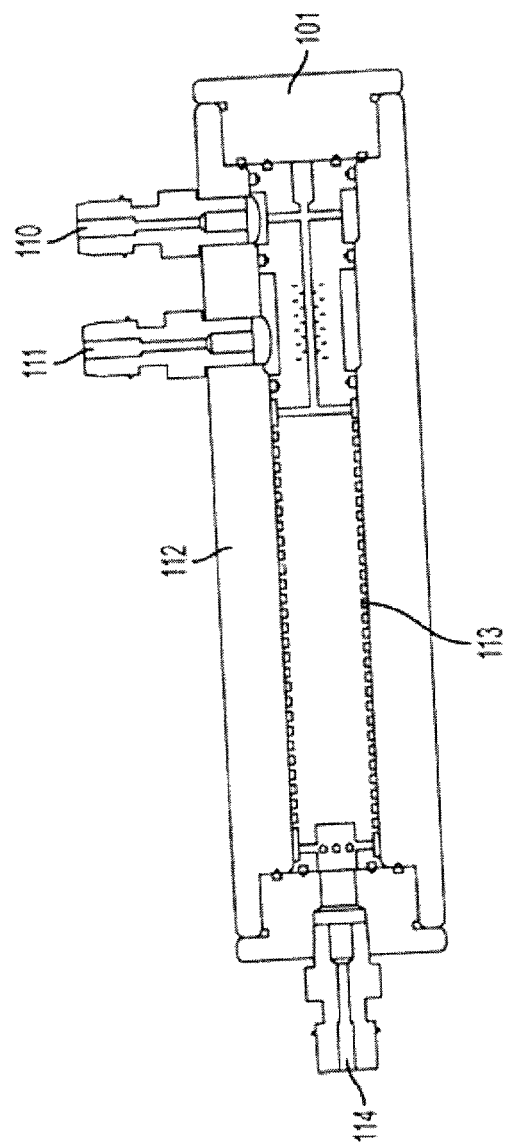
FIG. 4 is a diagram illustrating a sectional view of a male plug and female housing, in accordance with an example embodiment.

FIG. 4 is a diagram illustrating a sectional view of a male plug and female housing, in accordance with an example embodiment. In FIG. 4, the male plug 101 fits tightly into the female housing 112, creating a sealed helical channel 113 which facilitates further mixing of the initial foam into a final foam (e.g., P3). In particular example embodiments, the cross-sectional dimensions of the sealed helical channel might be approximately 0.06 inch×0.04 inch per section. In alternative example embodiments, the cross-sectional dimensions of the sealed helical channel might be approximately 0.06 inch×0.06 inch per section. It will be appreciated that a sealed helical channel with larger cross-sectional dimensions is more difficult to clog. Also depicted in FIG. 4 is a tube 110 through which a fluid (e.g., P2) enters into the plug 101 and a tube 111 through which a gas (e.g., nitrogen) enters the premix chamber of the plug 101. A final foam (e.g., P3) leaves the plug 101 through another tube 114.

It will be appreciated that final foams (e.g., P3) of different qualities are useful for different purposes, where quality might be defined as the volume of gas divided by the volume of gas and liquid on a scale that goes from 0% (no N2 and all P2) to 98% (100 sccm N2 and 2.5 mL/m P2). Further, as described below, for a given quality of foam (e.g., 80%), the surface and bulk size of bubbles in the foam and the surface and bulk spacing of bubbles in the foam is a function of the length (or distance) of the helical channel, where a longer length tends to produce bubbles that are smaller in surface and bulk size and smaller in surface and bulk spacing (e.g., closer together) for a given quality.

FIG. 5 is a diagram illustrating a sectional view of a male plug and female housing in a point-of-use system, in accordance with an example embodiment. In FIG. 5, the male plug 101 fits tightly into female housing 112, from which the male plug 101 can be readily removed for cleaning (e.g., with deionized water) or other maintenance. FIG. 5 shows a premix chamber 103 with an inlet 115 for P2 and an inlet 116 for nitrogen, which are alternative inlets to the inlets depicted in FIG. 4. FIG. 5 also shows the aperture 105 through which the final foam (e.g., P3) flows toward the proximity head which will be used to deposit the P3 on a substrate (e.g., a semiconductor wafer). In particular example embodiments which generate the final foam (e.g., P3) at the point of use of the foam, the proximity head might be located immediately to the left of FIG. 5, as described further below.

Figure 6A:
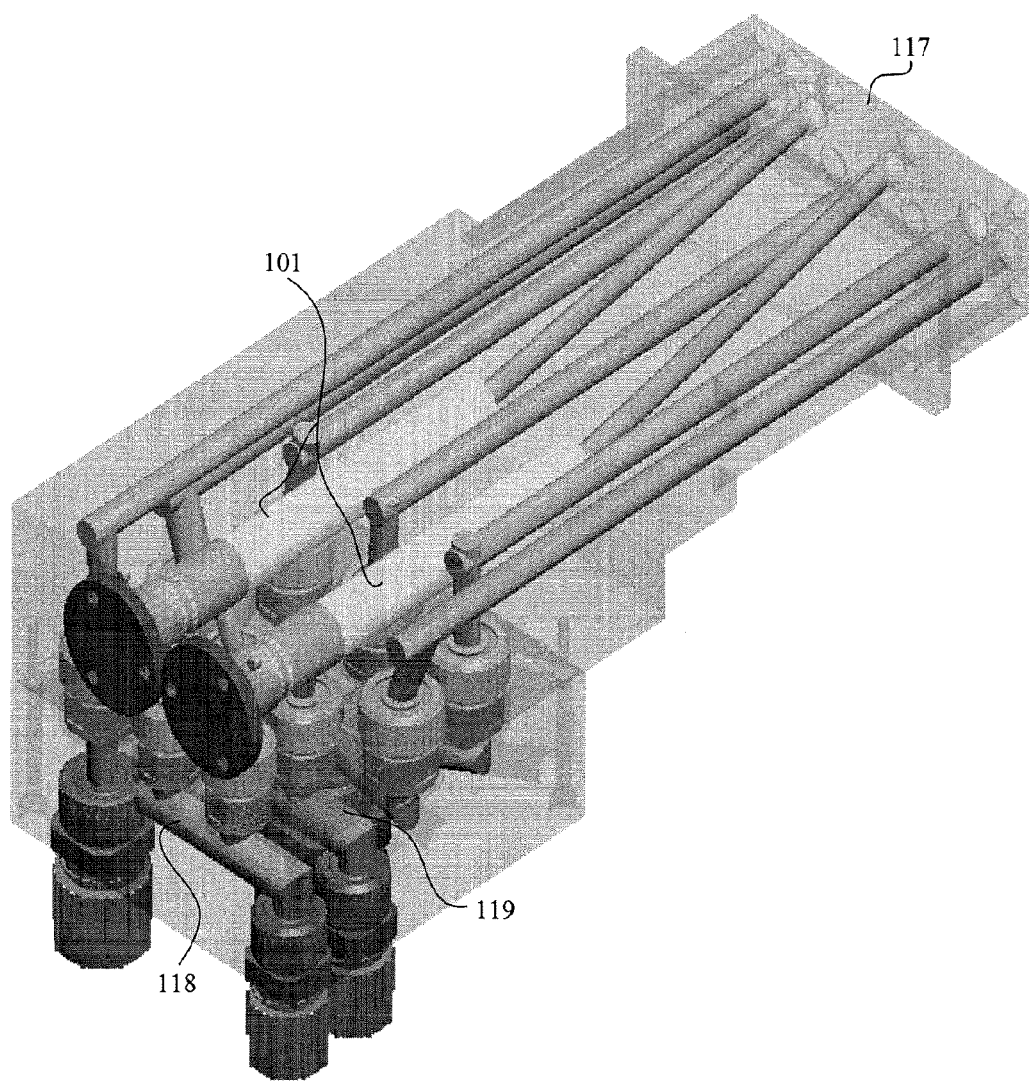
FIG. 6A is a diagram illustrating a perspective view of a male plug and female housing in a point-of-use system, in accordance with an example embodiment.

FIG. 6A is a diagram illustrating a perspective view of a manifold with two male plugs in a point-of-use system, in accordance with an example embodiment. In FIG. 6A, manifold 117 includes two male plugs 101 which provide final foam (e.g., P3) to a proximity head which is to the upper right outside of FIG. 6A. FIG. 6A also shows the transmission pipe 118 for the P2 fluid and the transmission pipe 119 for the nitrogen for the male plugs 101. It will be appreciated that this perspective view does not show the female housings for the male plugs 101, for purposes of exposition. However, the arrangement of components in FIG. 6A is similar to the arrangement of components in FIG. 5.

FIG. 6B is a simplified schematic diagram showing a pair of male plugs in a point-of-use system, in accordance with an example embodiment. In FIG. 6B, the pair of male plugs 101 (the female housings are not shown) generate and transmit foam to upper and lower proximity heads 121, which are located nearby in a processing station 120. The proximity heads 121 then deposit the foam, through the use of a meniscus 124, at a low velocity on a semiconductor wafer 122 carried by a wafer carrier 123. It will be appreciated that by generating the foam close to the foam's point of use in the meniscus 124, the system transmits the foam only a short distance, which is advantageous since the foam might be a highly viscous, non-Newtonian fluid, in a particular example embodiment.

Figure 6C:
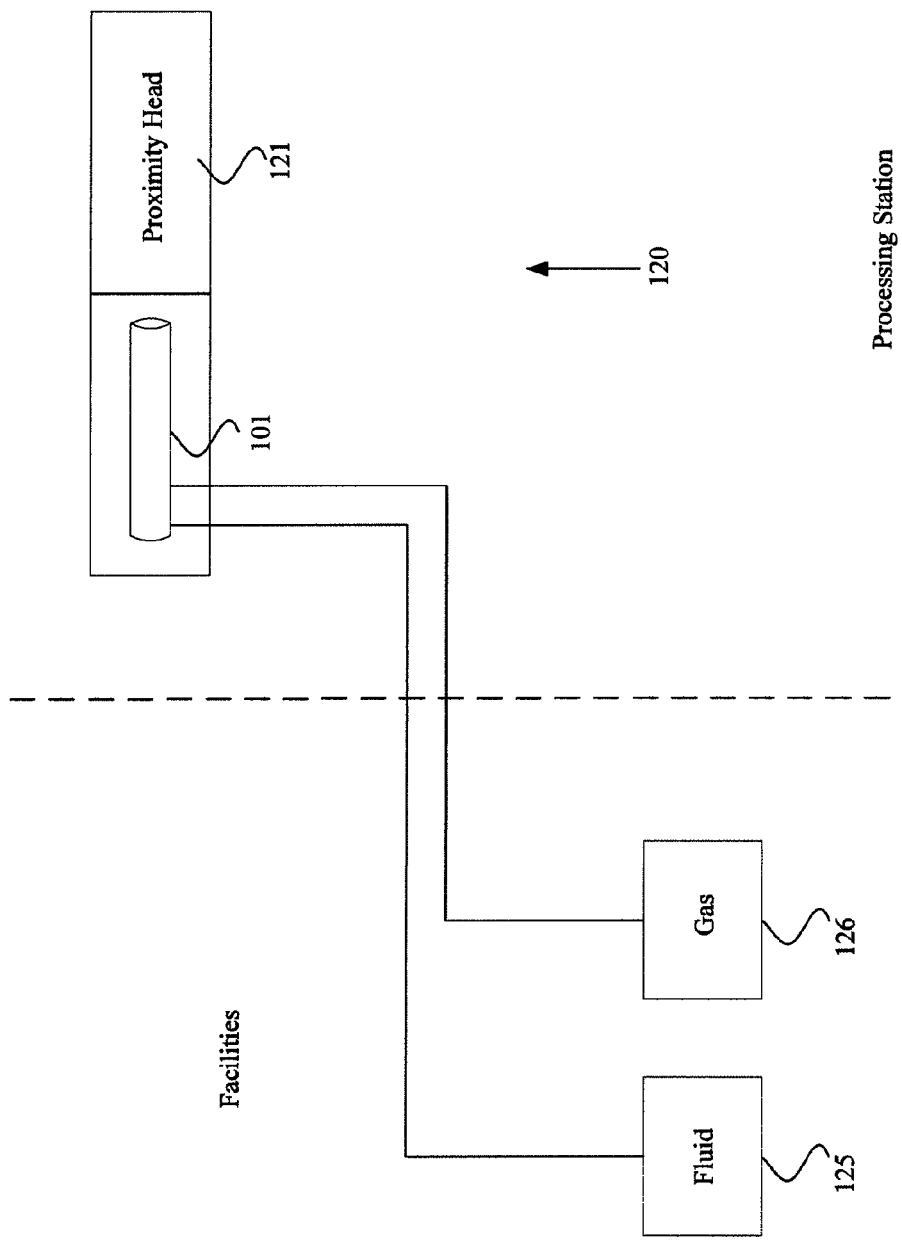
FIG. 6C is a simplified schematic diagram showing a processing station, in accordance with an example embodiment.

FIG. 6C is a simplified schematic diagram showing a processing station, in accordance with an example embodiment. In FIG. 6C, a male plug 101 is connected to a proximity head 121 (the female housing is not shown) in a processing station 120. The male plug 101 is also connected to a fluid supply 125 and a gas supply 126, which are located in facilities which might be some distance away from the processing station 120, in a particular example embodiment. It will be appreciated that the male plug 101 in FIG. 6C is nonetheless a component in a point-of-use system, since it is located close to proximity head 121, where the foam generated by the male plug 101 will be delivered at low velocity to a semiconductor wafer.

Figure 7:
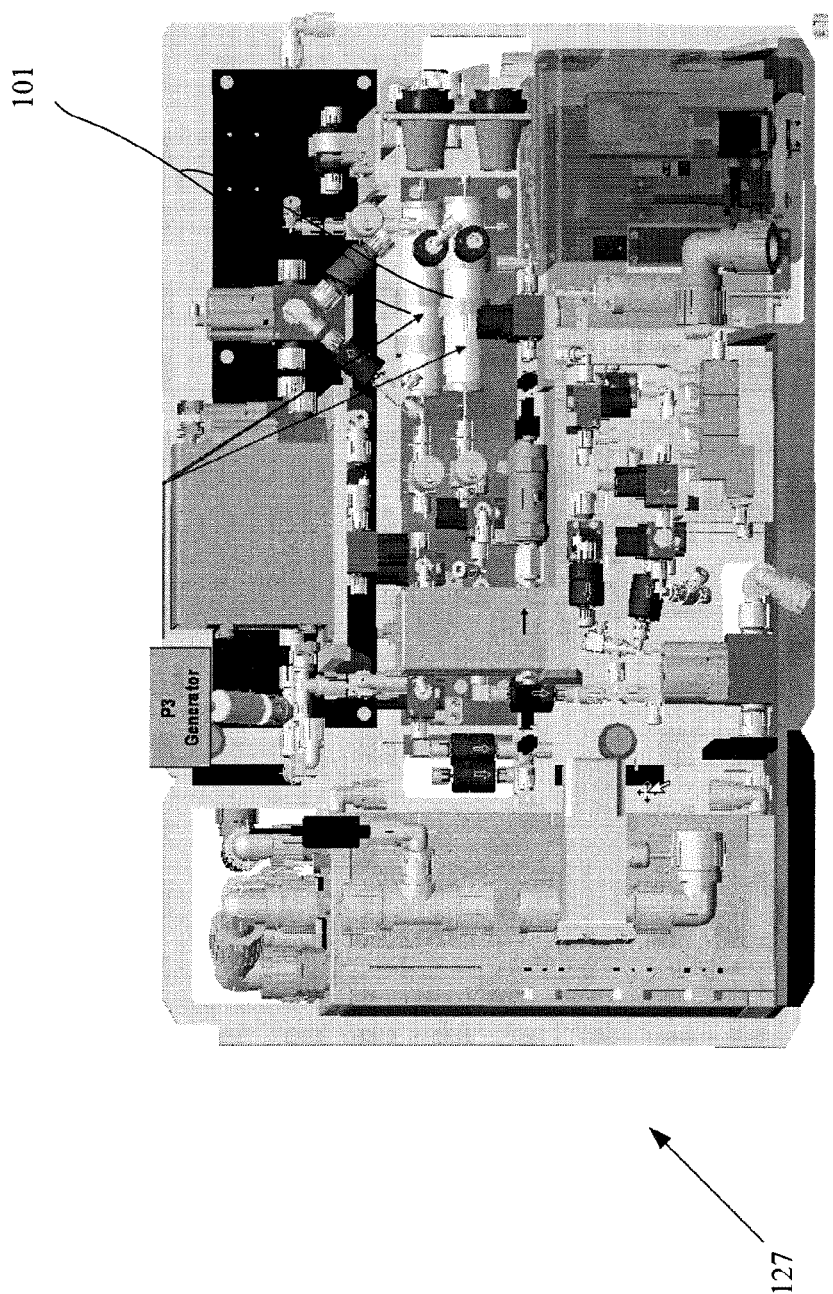
FIG. 7 is a diagram illustrating a perspective view of a male plug and female housing in an onboard fluid delivery system, in accordance with an example embodiment.

FIG. 7 is a diagram illustrating a perspective view of a male plug and female housing in an onboard fluid delivery system, in accordance with an example embodiment. As shown in FIG. 7, the onboard fluid delivery system 127 includes numerous components, including two male plugs 101. In particular example embodiments, the onboard fluid delivery system might be located in a cabinet beneath the proximity head that delivers the final foam (e.g., P3) to the substrate. It will be appreciated that in such a system the final foam (e.g., P3) is not generated at the point of use of the foam, though, as described above, the foam could still have small surface and bulk bubble size and small surface and bulk bubble spacing, if so desired.

Figure 8:
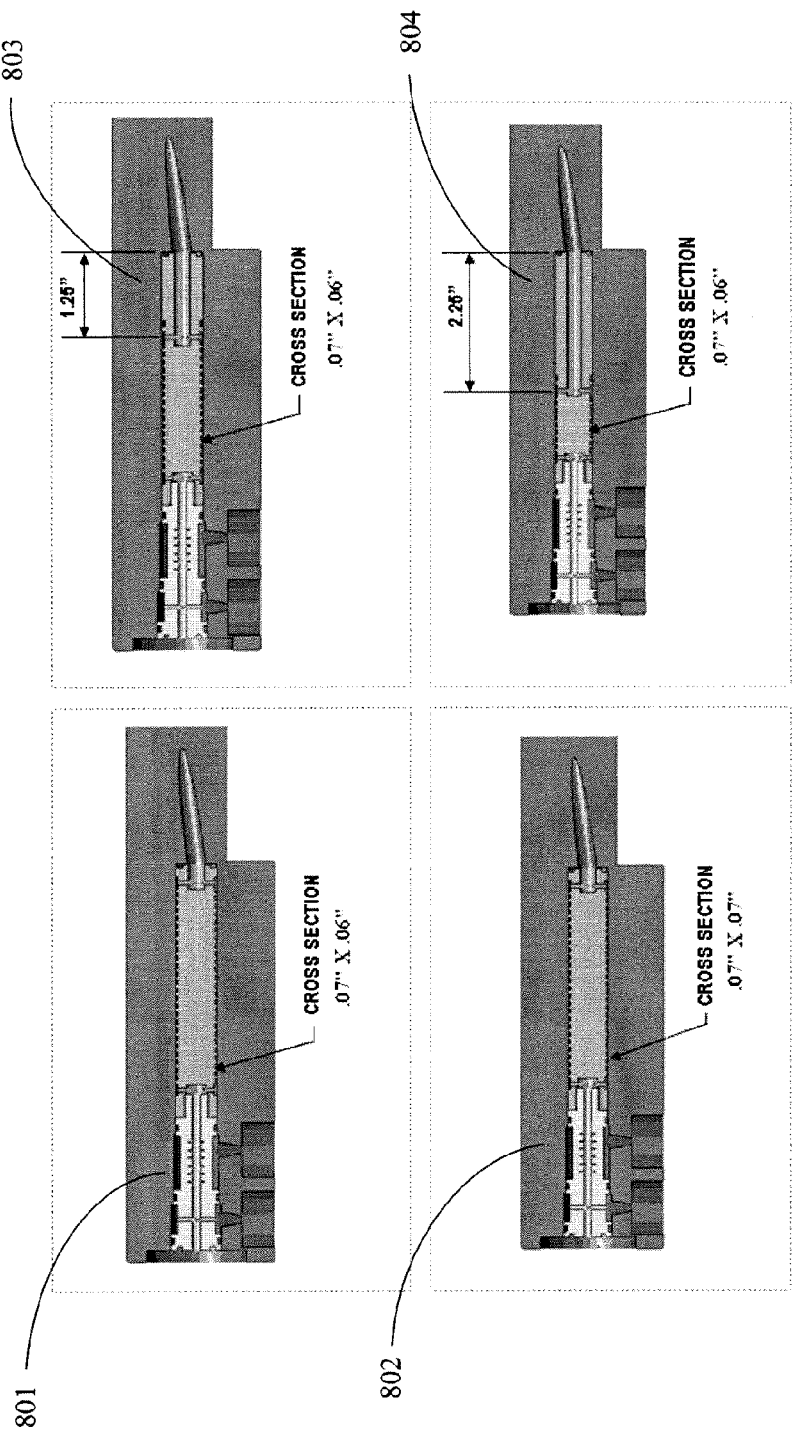
FIG. 8 is a diagram illustrating two independent variables, channel cross section and channel length, which were tested in example embodiments.

FIG. 8 is a diagram illustrating two independent variables, channel cross section and channel length, which were tested in example embodiments. In FIG. 8, test male plug 801 has a sealed helical channel with a cross section of 0.07 inch×0.06 inch, whereas test male plug 802 has a sealed helical channel with a cross section of 0.07 inch by 0.07 inch. In FIG. 8, test male plug 803 has a sealed helical channel which is 1 inch longer than test male plug 804 (e.g., 2.25 inch of "non-helical tubing"–1.25 inch of "non-helical tubing").

FIG. 9 is a table showing the results of the tests with respect to channel cross section and channel length, for example embodiments. In this table, the column labeled "Generator, one inch shorter" corresponds to FIG. 803 in FIG. 8 and the column labeled "Generator, two inch shorter" corresponds to FIG. 804 in FIG. 8; that is, the column labeled "Generator, one inch shorter" corresponds to a sealed helical channel which is one inch longer. It will be appreciated that the table demonstrates that longer channel length (or distance) produces bubbles of smaller size (e.g., surface and bulk) and spacing (e.g., surface and bulk) through the forces (e.g., friction, pressure, etc.) acting upon the foam (e.g., water, surfactant, and nitrogen). For a given foam quality (e.g., 80%), a generator whose sealed helical channel is one-inch longer tends to make bubbles with smaller surface bubble size (e.g., 134 versus 171 micrometers) and bulk bubble size (e.g., 189 versus 193 micrometers). Also, for the same foam quality (e.g., 80%), a generator whose sealed helical channel is one-inch longer tends to make bubbles with smaller surface bubble spacing (e.g., 316 versus 525 micrometers) and bulk bubble spacing (e.g., 209 versus 234 micrometers).

FIG. 10 is a table showing a comparison of the foam generator with a plug and housing and a foam generator with a long bead pack. For a given foam quality (e.g., 91%) and given amounts of gas and fluid (e.g., 400 sccm of N2 and 40 mL/m of P2), the foam generator with the plug and housing tends to make bubbles with an average surface bubble size that is comparable to the long bead pack (134 versus 131 micrometers). For the same foam quality and amounts of gas and fluid, the foam generator with a plug and housing tends to make bubbles with an average surface bubble spacing that is comparable to the long bead pack (318 versus 265 micrometers).

Figure 11:
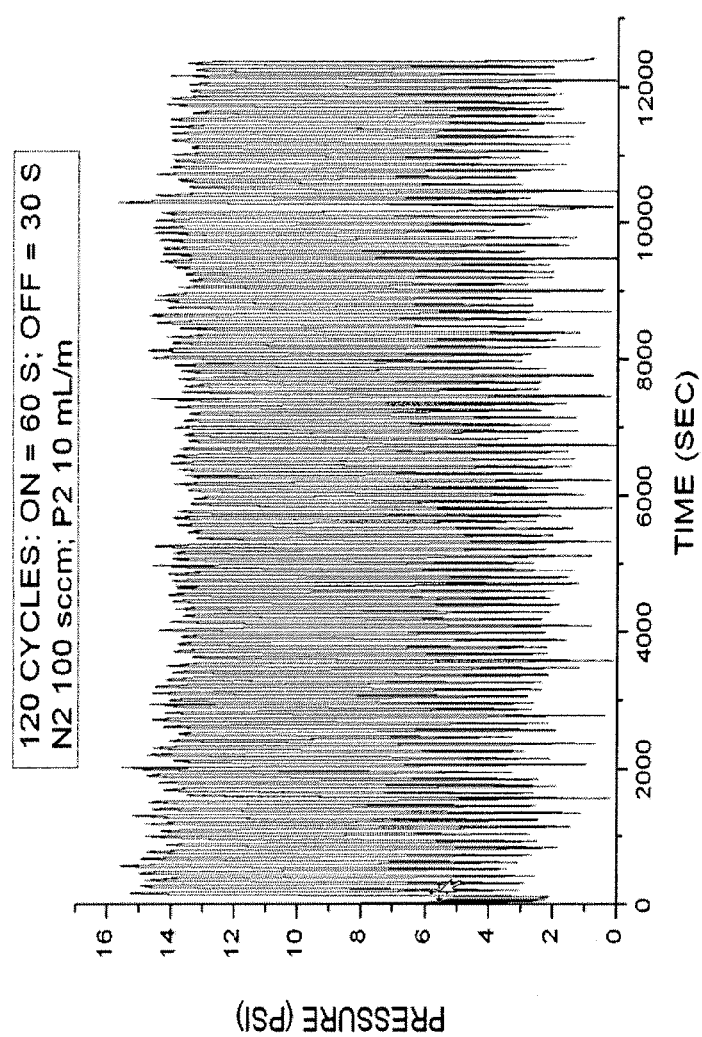
FIG. 11 is a plot of a time series showing back pressure for an example embodiment.

FIG. 11 is a plot of a time series showing back pressure for an example embodiment. As shown by this plot, the foam generator with a plug and housing tends to have a constant back pressure (e.g., PSI) as time progresses, which, in turn, tends to show that the foam generator has constant flow, e.g., the foam generator is not clogging. It will be recalled that clogging was a problem with the foam generator employing a bead pack.

Although the foregoing example embodiments have been described in some detail for purposes of clarity of understanding, it will be apparent that certain changes and modifications may be practiced within the scope of the appended claims. For example, the continuous helical indentation might be located on the female housing rather than the male plug, in alternative example embodiments. Furthermore, the invention as described herein might be used in other applications involving mechanical foam generation (e.g., in applications involving foams for oil and gas well drilling, culinary foams, and cosmetic foams). Accordingly, the example embodiments are to be considered as illustrative and not restrictive, and the invention is not to be limited to the details given herein, but may be modified within the scope and equivalents of the appended claims.

What is claimed is:

1. A method for generating a foam, comprising:
pumping a fluid into a premix chamber, wherein the premix chamber is a component of a male plug which fits into a female housing in a system for cleaning a substrate with the foam;
injecting a gas into the premix chamber to initiate generation of the foam from the fluid;
flowing the foam from the premix chamber into a sealed helical channel formed by a helical indentation on an outside surface of the male plug and an inner surface of the female housing to allow the foam to reach a desired state along a length of the sealed helical channel; and
outputting the foam from an exit end of the helical channel through the male plug to a component of the cleaning system.

2. The method of claim 1, wherein the desired state is with respect to bubble size and bubble spacing, for a given quality of the foam.

3. The method of claim 1, wherein the premix chamber further comprises a hollow cylinder through which the fluid flows and into which the gas is injected.

4. The method of claim 3, wherein the gas is injected into the hollow cylinder through injection channels which facilitate the creation of a vortex within the hollow cylinder.

5. The method of claim 4, wherein the injection channels are tangential to the axis of the hollow cylinder.

6. The method of claim 4, wherein the injection channels are defined in a pattern.

7. The method of claim 6, wherein the pattern is oriented at a set degree of separation between about 5 and 20 degrees.

8. The method of claim 1, wherein the fluid comprises water and a surfactant.

9. The method of claim 1, wherein the method is used to provide foam at the point of use of the foam.

10. The method of claim 9, wherein the foam is used to clean a substrate.

11. The method of claim 10, wherein the substrate is a semiconductor wafer.

12. A method for generating a foam, comprising:
pumping a fluid into a premix chamber, wherein the premix chamber is a component of a male plug which fits into a female housing in a system for cleaning a semiconductor wafer with the foam;
injecting a gas into the premix chamber to initiate generation of the foam from the fluid;
flowing the foam from the premix chamber into a sealed helical channel formed by a helical indentation on an outside surface of the male plug and an inner surface of the female housing to reach a desired state for a given quality of the foam; and
outputting the foam from an exit end of the helical channel through the plug to a component of the cleaning system.

13. The method of claim 12, wherein the quality of the foam is measured by dividing a volume of the gas by a sum of the volume of the gas and a volume of the fluid.

14. The method of claim 12, wherein the premix chamber further comprises a hollow cylinder through which the fluid flows and into which the gas is injected.

15. The method of claim 14, wherein the gas is injected into the hollow cylinder through injection channels which facilitate the creation of a vortex within the hollow cylinder.

16. The method of claim 15, wherein the injection channels are tangential to the axis of the hollow cylinder.

17. The method of claim 15, wherein the injection channels are defined in a pattern which is oriented at a set degree of separation between about 5 and 20 degrees.

18. The method of claim 12, wherein the fluid comprises water and a surfactant.

19. A method for generating a foam, comprising:
pumping a fluid into a premix chamber, wherein the premix chamber is a component of a male plug which fits into a female housing in a system for cleaning a semiconductor wafer with the foam;
injecting a gas into the premix chamber to initiate generation of the foam from the fluid;
flowing the foam from the premix chamber through a sealed helical channel formed by a helical indentation on an outside surface of the male plug and an inner surface of the female housing to allow the foam to reach a desired state with respect to bubble size and bubble spacing, for a given quality of the foam.

20. The method of claim 19, wherein the quality of the foam is measured by dividing a volume of the gas by a sum of the volume of the gas and a volume of the fluid.

* * * * *